United States Patent [19]

Doe et al.

[11] Patent Number: 4,843,695

[45] Date of Patent: Jul. 4, 1989

[54] METHOD OF ASSEMBLING TAB BONDED SEMICONDUCTOR CHIP PACKAGE

[75] Inventors: Ralph W. Doe, Auburn, Mass.; Stephen P. Hansen, Amherst, N.H.; Kenneth M. Brown, North Andover, Mass.

[73] Assignee: Digital Equipment Corporation, Maynard, Mass.

[21] Appl. No.: 73,991

[22] Filed: Jul. 16, 1987

[51] Int. Cl.⁴ .......... H01L 21/88

[52] U.S. Cl. .......... 29/827; 174/52.4; 29/840

[58] Field of Search .......... 174/52 FP; 357/74; 437/210, 215, 217, 218; 29/827, 840

[56] References Cited

U.S. PATENT DOCUMENTS

| | | | |
|---|---|---|---|
| 3,374,537 | 3/1968 | Doelp, Jr. | 174/52 FP X |
| 4,096,348 | 6/1978 | Robillard et al. | 174/52 FP |
| 4,472,876 | 9/1984 | Nelson | 174/52 FP X |
| 4,631,820 | 12/1986 | Harada et al. | 174/52 FP X |
| 4,672,418 | 6/1987 | Moran et al. | 357/70 |

FOREIGN PATENT DOCUMENTS

| | | |
|---|---|---|
| 61-24261 | 7/1984 | Japan . |
| 60-165748 | 8/1984 | Japan . |

*Primary Examiner*—Fred L. Braun
*Assistant Examiner*—David A. Tone
*Attorney, Agent, or Firm*—Nutter, McClennen & Fish

[57] ABSTRACT

A package for housing fabricated semiconductor chips is disclosed. The package has ceramic base with a raised outer shelf extending around its periphery. The outer shelf defines a space in the package where the chip is seated. A lead frame with a number of individual conductive leads is disposed over the outer shelf. A section of tape automated bonding tape is used to provide electrical connections between bonding points on the chip and the lead frame leads; the tape automated bonding tape carries a number of conductive leads each of said leads having an inner lead portion attached to a chip bonding point, and an outer lead portion attached to a lead frame lead. A frame is secured over the base outer shelf so the lead frame is embedded therebetween. A lid is secured over the frame to completely enclose the chip within the package. An adhesive that can be cured at a low temperature so as to not delaminate the tape automated bonding tape, is used to secure the frame and lead frame to the base, secure the chip in the space and secure the lid to the frame.

9 Claims, 3 Drawing Sheets

METHOD OF ASSEMBLING TAB BONDED SEMICONDUCTOR CHIP PACKAGE

FIELD OF THE INVENTION

This invention relates generally to the field of packaging for integrated circuit chips, and more particularly to a package compatible with chips attached to tape automated bonding tape.

BACKGROUND OF THE INVENTION

Packaging is one of the final steps in the process of manufacturing integrated electrical semiconducting circuit components or chips. In packaging, a fabricated semiconductor chip is mounted in a protective housing. After packaging, the assembled component is subjected to final testing and then connected to an electronic circuit.

Currently, many semiconductor chips are contained in plastic packages. These packages are provided with reinforced metal leads for electrically connecting the chip to the printed circuit board which contains the circuit in which the chip is to be included Within the package, one end of each lead is connected to a specific bonding point on the chip, usually by an intermediate lead; the other end of the lead, which extends outside of the package, is attached to a connection on the printed circuit board.

Recently, advances in semiconductor manufacturing technology have made the fabrication of Very Large Scale Integration (VLSI) chips possible. VLSI chips comprise a large number of individual circuit components that are fabricated together on a single, very small chip. VLSI chips are able to perform a large number of electrical functions, and perform them more rapidly, than was previously possible.

To date, it has been difficult to provide suitable packaging for VLSI chips. One reason for this is because each VLSI chip requires a large number of connections to external circuit elements. Many VLSI chips have 100 to over 300 bonding points, each of which must be individually connected to a lead for connection to external circuit elements. This is a difficult task to perform because of the space in which these connections must be made is very small and because the chips are relatively fragile devices and the connections to them must be made with a considerable amount of care.

Tape Automated Bonding (TAB) is one of the few practical methods that have been developed in order to provide electrical connections to VLSI chips. In TAB, a chip is bonded to a section of TAB tape that has a number of individual leads that are plated on a film of insulating material. The film, which serves as a support for the leads, has a center opening which the chip is mounted over. The TAB leads are arranged so they extend outward from a center opening of the film; and project beyond its outer perimeter. Thus, each TAB lead has an inner lead portion that extends into the center opening of the film and an outer lead portion that extends beyond the outer perimeter of the film. A chip is positioned over the film center lead opening and is bonded to the lead inner lead portions at its bonding points; the outer lead portions of the leads are then attached to the appropriate conductive elements, such as contact pads on a printed wire board. Since the film can support an almost limitless number of leads, TAB has been an especially effective means to provide electrical connections to the bonding points of VLSI chips. Moreover, TAB is a cost-effective means of providing electrical connection to the chips.

Another reason that, to date, it has been difficult to provide a package suitable for a VLSI chip is the need to include a means to efficiently dissipate the heat generated by the chip. A chip generates heat as a consequence of its consuming power in order to perform the function it is designed for. Heat dissipation is an important consideration in the design of a chip package because most chips should be operated at temperatures below 80° C. If a chip becomes too hot, the semiconductor junctions, which form the basic electrical components within the chip, have a tendency to break down and the chip may malfunction.

Heat dissipation characteristics are an especially important consideration in packages designed to house VLSI chips. This is because VLSI chips consume more power than their predecessors, and as a result, generate more heat. Therefore, a package in which a VLSI chip is housed should include some means to efficiently extract the heat, or otherwise cool the chip therein in order to insure it consistently functions properly.

There have been a number of chip packages developed which provide some path, such as a cooling fluid or a heat spreader, through which heat can be diffused away from the chips therein. However, many of these packages are designed so that only reinforced contact pins can be used to provide the needed electrical connections between the external circuit and the chips within the packages. In order to mount the package with contact pins on a circuit board, complementary plated-through holes are needed on the circuit board. The plated-through holes extend through the circuit board in which they are formed, and as a result, the conductors on the circuit board must be designed around them. This may be difficult task if the circuit board contains a large number of conductors, as is required by most modern electronic circuits.

One type of semiconductor package, designed for individual chips, that has good heat dissipation characteristics is the cerquad package. A cerquad package is formed of ceramic with a base that includes a raised shelf around its perimeter that defines a seating space where the chip is housed. A lead frame, formed of spaced apart reinforced metal leads, is embedded between the shelf, above where the chip is seated, and a ceramic frame disposed over the base. Each metal lead has an interior portion which projects into the interior of the package and an exterior portion which extends out from the package. A lid is secured to the frame over the seating space so as to complete the package and protect the chip therein.

A chip is assembled inside a cerquad package by first securing the chip in the seating space by a process known as die attachment. The bonding points on the chip are then electrically connected to the appropriate leads by wires that are individually attached therebetween. The lid is sealed over the seating space to complete the assembly process. In the assembled cerquad package, the metal leads function as conductive paths between the chip and the associated components of the electronic circuit the chip is connected to.

Cerquad packages have good thermal conductivity characteristics, that is heat readily transfers through them. A cooling fin assembly can readily be attached to the outer surface of the base of a cerquad package, so the heat transferred thereto from the chip can be rapidly diffused into the external environment. Cerquad packages can be readily manufactured to contain a single chip. Also, cerquad packages have leads that enable them to be easily surface mounted to the circuits which the chips they house are designed for. This eliminates the need to provided plated-through holes on the circuit board for electrically connecting the chip to the circuit, and the attendent need to design the circuit board conductors around the plated-through holes. Moreover, cerquad packages are very economical to manufacture. Thus, it is often desirable to package a stand-alone chip with significant heat generating characteristics in a cerquad package.

To date, however, it has been difficult to house a VLSI chip inside a cerquad package. This is in part due to the problems associated with connecting the bonding points of a VLSI chip to the package leads that connect the chip to the other elements of the circuit it is attached to. Wire bonding of the individual bonding points to the individual leads is a time consuming and expensive process that is prone to error because of the large number of leads and small spaces involved.

It has also been very difficult to house a chip with TAB leads inside a cerquad package. In part this is because the cerquad lead frame inevitably warps when it is embedded in the package. As a result, the lead frame leads are uneven and the outer lead portions of the TAB leads cannot be attached thereto by automated processes, such as one referred to as "gang bonding" which require the attachment be preformed on an even surface. The TAB lead outer lead portion must thus be individually attached to the lead frame leads. This is a costly process that is prone to error.

Moreover, glass is normally used to seal the frame to the base of a cerquad package so as to embed the lead frame therebetween. In order to apply the glass to the package, the glass's temperature must be raised to its flow point, which typically is 400° C. Problems arise because TAB film starts to delaminate at approximately 300° C. As a result of the delamination, the TAB leads warp, cross, and become loosened from their bonding points on the chip and from the cerquad package leads so as to render the assembled package useless. Thus, it has been very difficult to attach a VLSI chip, or any other TAB bonded chip, in a cerquad package.

SUMMARY OF THE INVENTION

This invention provides a new and improved cerquad package for semiconductor chips that can be used in conjunction with TAB bonded chips including VLSI chips that are so bonded. The cerquad package of this invention can also be economically assembled as part of the process used to house the chip in the package.

In brief summary, the cerquad package of this invention includes a base with a raised outer shelf around its perimeter that defines a seating space for the chip. A lead frame containing a number of individual leads that extend to the perimeter of the seating space is disposed over the shelf. A frame is fastened over the shelf so the lead frame is secured therebetween. A lid is fastened over the frame and seating space.

The cerquad package is assembled by first bonding the chip to the inner lead portions of a section of TAB tape. The chip and tape subassembly is attached to the lead frame by bonding the outer lead portions of the TAB tape to the lead frame. The subassembly is then attached to the base by simultaneously die bonding the chip inside the seating space and fastening the frame to the shelf. The lid is then secured over the frame to complete the assembly process. Epoxies, which are cured at temperatures below 200° C., are used to die attach the chip in the seating space, to secure the frame to the base and the lead frame therebetween, and to secure the lid over the frame.

An advantage of this cerquad package is that it can be used to house TAB bonded chips and provide electrical connections between the chips and other circuit elements. Moreover, this package is formed primarily from ceramic which has good thermal conductivity characteristics. Thus, this package is readily suited to accommodate VLSI chips which are frequently provided with TAB leads for electrical connections, and which generate significant amounts of heat.

The cerquad package of this invention can be economically assembled in an automated production process, and the chip can be inserted in the package during the production process. The economy of assembling this cerquad package is achieved in part because the TAB leads can be automatically and inexpensively be attached to both the bonding points on the chip and the lead frame leads. Additional cost advantages are obtained with this cerquad package because the package is assembled as part of process of housing the chip therein. This further reduces the expense of providing the package since the assembler does not have to purchase a pre-assembled package.

DETAILED DESCRIPTION OF THE INVENTION

Figure 1:
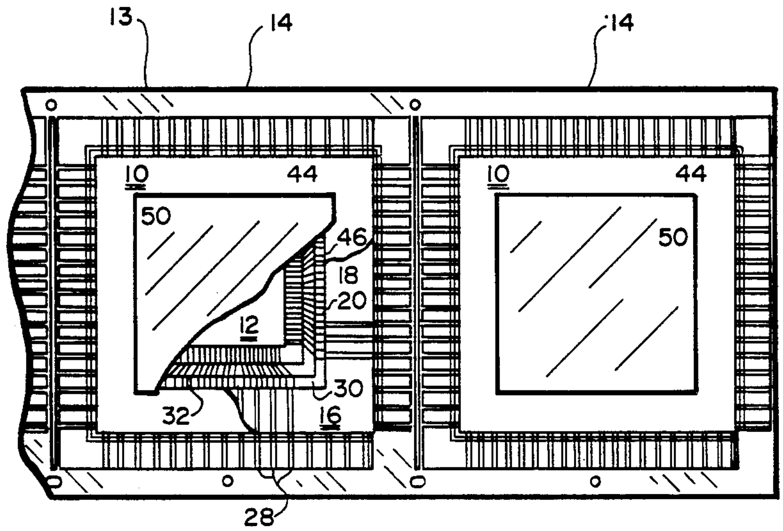
FIG. 1 is a top exploded view of a cerquad package of this invention attached to a portion of a lead frame strip after the package assembly process and prior to separating from the lead frame strip.

FIG. 1 illustrates a number of cerquad packages 10, constructed in accordance with this invention each of which contains a single semiconductor chip 12. The cerquad packages 10 are attached to a lead frame strip 13 that comprises a number of individual lead frames 14 linearly attached together so the cerquad packages 10 may be assembled automatically by equipment that sequentially advances the lead frame 13 that carries the partially assembled packages 10 to different assembly stations. After the cerquad packages 10 are assembled, they are severed from the lead frame strip 13 for final testing and installation into the circuit they are designed for.

The individual cerquad packages 10 each contain a base 16 formed of ceramic. Extending around the outer perimeter of the base 16 is a raised outer shelf 18 that defines a seating space 20 within the center of the base. The chip 12, such as a VLSI chip, is die attached into the seating space 20.

Each lead frame 14 is positioned on the base outer shelf 18 of the cerquad package 10 it is part of and comprises a number of separate reinforced metal leads 28. Each lead frame lead 28 extends from the edge of the outer shelf 18 adjacent to the seating space 20 to beyond the perimeter of the cerquad package 10 so it can be surface mounted to a contact pad on the printed circuit board the package is intended for. A ring of Kapton 29 (FIG. 2b), or other suitable dielectric, may be secured to the lead frame leads 28 to prevent them from becoming out of alignment.

Figure 2A:
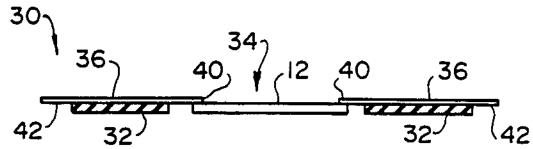
FIG. 2*a* is a cross-section view of a chip inner lead bonded to a section of tape automated bonding tape.

A section of TAB tape 30, best seen by reference to FIG. 2a, is attached to the chip 12 and lead frame leads. The TAB tape 30 comprises a section of film 32 of Kapton, or other suitable dielectric, with a center opening 34 to accommodate the chip 12 and a number of flexible conductive leads 36 plated thereon. Each TAB lead 36 has an inner lead portion 40 that projects into the center opening 34 which is attached to a bonding point on the chip 12, and an outer lead portion 42 which is bonded to a lead frame lead 28.

A ceramic frame 44 is fastened to the base outer shelf 18 so that the lead frame 14 is secured therebetween. The frame 44 defines an opening 46 over the chip 12, the seating space 20, the TAB tape 30, and the portion of the lead frame metal leads 28 where the TAB leads 36 are attached thereto. Epoxy 48 (FIG. 2c), or other suitable adhesive, that can be cured at temperatures below that which the TAB tape 30 desalinates, and when secured forms a liquid-tight seal, is used to secure the frame 44 and base 16 together. A lid 50 is sealed over frame opening 46 to complete the protective shell the cerquad package 10 provides around the chip 12.

Figure 2B:
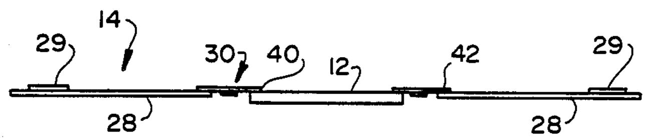
FIG. 2*b* is a cross-section view of the assembly of FIG. 2*a* outer lead bonded to a lead frame.
Figure 2C:
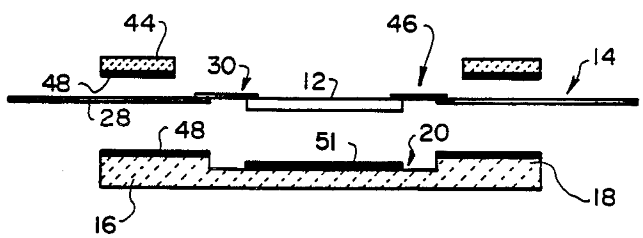
FIG. 2*c* is a cross-section view of the assembly of FIG. 2*b* lead embedded and die attached into a cerquad package.

Referring to FIGS. 2a–e, the assembly of the cerquad package 10 is shown in detail. Initially, the chip 12 is bonded to the TAB lead inner lead portions 40 of the TAB tape 30, (FIG. 2a) in accordance with known TAB bonding practices. The TAB lead outer lead portions 42 are then attached to the lead frame leads 28 (FIG. 2b). The TAB lead outer lead portions 42 and lead frame leads 28 are attached together by a process known as "gang bonding" wherein by an automated process all the outer lead portion 42 to lead frame lead 28 bonding occurs simultaneously. This assembly occurs while the individual lead frames are attached to the lead frame strip 13 (FIG. 1).

The lead frame 14-TAB tape 30-chip 12 subassembly is then advanced to a station (FIG. 2c) where it is attached to the base 16 and frame 44. At this station the chip 12 is secured in the seating space 20 by the process of die attachment wherein a suitable adhesive 51 known in the art is used to secure the chip 12 therein. Concurrently with the die attachment, the lead frame 14 is embedded in the package 10 by positioning the frame 44 over the base outer shelf 18 and applying the epoxy 48 to fasten the two together, securing the lead frame 14 therebetween.

The epoxy 48 used to fasten the frame 44 to the outer shelf 18 is applied to the opposed surfaces of the ceramic base outer shelf 18 and the frame 44 prior to the lead embedding process. The epoxy 48 is applied so it is partially cured, in a "B-stage," so it can later be cured, or reflowed around the lead frame leads 28, during the lead embedding process. During the lead embedding process, the epoxy is cured at a temperature below 200° C. A suitable epoxy for this purpose is Epoxy No. NCO-125RF manufactured by the Kyocera Company of Kyoto, Japan, which can be cured, will reflow at, a temperature below 200° C., and after curing forms a liquid-tight seal.

Figure 2D:
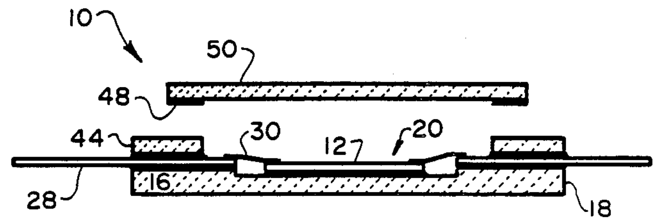
FIG. 2*d* is a cross-section view of the assembly of FIG. 2*c* receiving a lid.
Figure 2E:
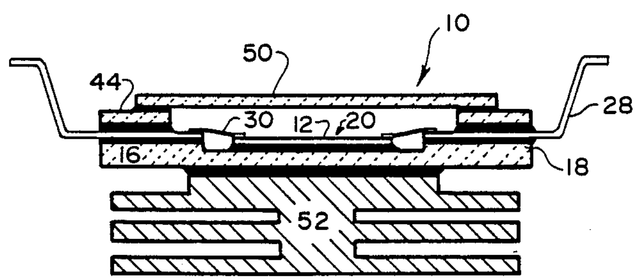
FIG. 2*e* is a cross section view of the assembled cerquad package of FIG. 2*d* after a heat sink has been attached thereto and the metal leads have been shaped.

After the die attachment and lead frame embedding processes are completed, the partially assembled package 10 is advanced to a curing station where air is vented away from the package. The venting of air away from the package evacuates any volatiles that may be emitted from the epoxy 48 when it is applied and cured. After the epoxy 48 adjacent to the lead frame 14 and chip 12 has at least partially cured, the lid 50 may be attached to complete assembly of the cerquad package 10 using the epoxy 48 as an adhesive (FIG. 2d). At this stage, it is only necessary to pre-apply the epoxy 48 to one of the surfaces that are attached together; typically the epoxy 48 is only pre-applied to the lid 50.

After the cerquad package 10 is assembled, it is severed from the lead frame strip 13. The exposed portions of the lead frame leads 28 may then be shaped so they will contact the surface contact pads that they are to be connected to (FIG. e). A heat sink 52 may be attached to cerquad packages 10, usually on a portion of the exposed face of the base 16 adjacent to the chip 12. Thus when the assembled package is mounted on a circuit board, the lid is positioned adjacent the board.

The assembled cerquad package 10 protects the chip 12 therein from external forces. Moreover, the ceramic material of this package readily conducts heat therethrough; the large amounts of heat a chip may generate will thus be readily transferred away therefrom to the external surface of the package. In other words, the heat generated by the chip 12 will be efficiently conducted away therefrom through the package 10, minimizing the possibility the chip 12 will malfunction due to becoming overheated. Also, the package can be readily designed to accommodate a single chip 12 and not occupy an excessive amount of space.

The chip 12 housed within the cerquad package is electrically connected to the lead frame leads 28 by a section of TAB tape 30. The use of the TAB tape 30 to make the electrical connections is possible in part because the epoxy 48 cures at a relatively low temperature. At the temperature the epoxy 48 is cured, the TAB tape 30 will not delaminate so as to cause the TAB leads 36 to become loose and break their connections to the chip bonding points and the lead frame leads 28, severing the electrical connections therebetween. Also, the lead frame leads 28 are planar prior to the attachment of the chip 12 and TAB tape 30 sub-assembly thereto. This makes it possible to perform such attachment by gang bonding or other automated processes that require attachment to be performed on a level surface.

The cerquad package 10 is well suited to accommodate a VLSI chip which typically has a large number of bonding points, is usually provided with TAB bonded electrical connections, and that generates significant amounts of heat which must be efficiently dissipated away therefrom.

After the chip 12 is die attached to this cerquad package, the air adjacent the package is vented away prior to securing the lid 50 to the frame 44. The venting evacuates volatiles that the epoxy 48 or die attachment adhesive may emit while they cure. This minimizes the concentration of volatiles adjacent the chip 12 that may corrode it, causing its semiconductor junctions to break down and the chip 12 to malfunction.

This cerquad package 10 can be economically assembled. In part, this is because the electrical connections required by the package, the inner lead bonding of the TAB leads 36 to the chip bonding points and outer lead bonding of the TAB leads 36 to the lead frame leads 28, can both be performed economically and rapidly by automated equipment that does not make a significant number of assembly errors.

Another reason the cerquad package 10 is economical to assemble is that the components of the package are assembled simultaneously with mounting the chip inside the package. It is more cost-effective for the assembler to assemble the package at this time than to purchase a pre-assembled cerquad package from another source.

The foregoing description has been limited to a specific embodiment of the invention. It will be apparent, however, that variations and modifications may be made to the invention, with the attainment of some or all of the advantages of this invention. For instance, it would be possible to construct a semiconductor package of this invention designed to accommodate two or more semiconductor chips. A multi-chip package could be constructed to house the chips in one large seating space, or be provided with separate seating spaces for each of the chips therein. Also, the package of this invention may be constructed out of material other than ceramic that has the appropriate thermal conductivity characteristics. Adhesives other than epoxy may be used to lead embed the lead frame and die attach the chips. Therefore, it is the object of the appended claims to cover all such variations and modifications as come within the true spirit and scope of the invention

What is claimed as new and desired to be secured by Letters Patent of the United States is

1. A method of assembling a semiconductor package containing an electronic component therein, comprising the steps of:

(a) inner lead bonding a section of tape automated bonding tape to the electronic component, said tape automated bonding tape having a plurality of conductive leads thereon, each tape automated bonding lead having an inner lead portion and an outer lead portion, wherein in said inner lead bonding said inner lead portions are attached to bonding points on the electronic component;

(b) outer lead bonding the tape automated bonding tape to a lead frame, said lead frame having a plurality of spaced apart reinforced metal leads, wherein in said outer lead bonding said tape automated bonding lead outer lead portions are attached to said lead frame leads; and (c) substantially simultaneously die attaching said electronic component and tape automated bonding tape in the semiconductor package and embedding said lead frame in said semiconductor package, wherein said semiconductor package includes a base defining a seating space for disposing the electronic component and tape automated bonding tape therein and a lid assembly disposed over said base and seating space so that said lead frame is embedded therebetween, wherein in said die attaching the electronic component is secured in said base seating space and in said lead frame embedding said lead frame is disposed on said base and said lid assembly is secured to said base so said lead frame is embedded therebetween.

2. The method of assembling a semiconductor package according to claim 1 further including the step of curing an adhesive applied to said base to fasten said lid assembly to said base so as to embed said lead frame therebetween.

3. The method of assembling a semiconductor package according to claim 2 further including curing the adhesive at a temperature below 200° C.

4. The method of assembling a semiconductor package according to claim 2 further including curing said adhesive at a temperature substantially below that at which said tape automated bonding tape delaminates.

5. A method of assembling a semiconductor package containing an electronic component therein, comprising the steps of:

(a) inner leading bonding a section of tape automated bonding tape to the electronic component, said tape automated bonding tape having a plurality of conductive leads thereon, each tape automated bonding lead having an inner lead portion form bonding to said electronic component and an outer lead portion, wherein in said inner lead bonding said inner lead portions are attached to bonding points on the electronic component;

(b) outer lead bonding tape automated bonding tape to lead frame, said lead frame having a plurality of spaced apart reinforced metal leads, wherein in said outer lead bonding said tape automated bonding lead outer lead portions are attached to said lead frame leads;

(c) substantially simultaneously die attaching said electronic component and tape automated bonding tape in the semiconductor package and embedding said lead frame in said semiconductor package, wherein said semiconductor package includes a base defining a seating space for disposing the electronic component and tape automated bonding tape therein and a frame disposed over said base and seating space so that said lead frame is embedded therebetween, said frame defining a frame opening wherein in said die attaching the electronic component is secured in said base seating space and in said lead frame embedding said lead frame is disposed on said base and said frame is secured to said base so said lead frame is embedded therebetween; and (d) securing a lid on said frame over said frame opening.

6. The method of assembling a semiconductor package according to claim 5 further including the step of curing an adhesive applied to said base to secure said frame to said base so as to embed said lead frame therebetween, and to secure said lid to said frame.

7. The method of assembling a semiconductor package according to claim 6 further including curing the adhesive at a temperature below 200° C.

8. The method of assembling a semiconductor package according to claim 6 further including curing said adhesive at a temperature substantially below that at which said tape automated bonding tape delaminates.

9. The method of assembling a semiconductor package according to claim 5 further including the step of venting the air adjacent the semiconductor package after the die attachment and lead embedding and prior to securing the lid thereto.

* * * * *